(12) United States Patent
Ho et al.

(10) Patent No.: US 7,649,384 B2
(45) Date of Patent: Jan. 19, 2010

(54) HIGH-VOLTAGE TOLERANT OUTPUT DRIVER

(75) Inventors: Seng Poh Ho, Singapore (SG); Tak Ying Wong, Singapore (SG); Yow Ching Cheng, Singapore (SG); Ricky Setiawan, Singapore (SG)

(73) Assignee: Broadcom Corporation, Irvine, CA (US)

( * ) Notice: Subject to any disclaimer, the term of this patent is extended or adjusted under 35 U.S.C. 154(b) by 12 days.

(21) Appl. No.: 12/068,325

(22) Filed: Feb. 5, 2008

(65) Prior Publication Data
US 2009/0195267 A1 Aug. 6, 2009

(51) Int. Cl.
*H03K 19/0185* (2006.01)

(52) U.S. Cl. .............................. 326/83; 326/81; 326/68; 327/543; 327/112

(58) Field of Classification Search ................... 326/81, 326/83; 307/35; 327/112, 543; 361/18; 363/60
See application file for complete search history.

(56) References Cited

U.S. PATENT DOCUMENTS

| | | | | |
|---|---|---|---|---|
| 5,574,389 A | * | 11/1996 | Chu | .............................. 326/81 |
| 6,208,167 B1 | * | 3/2001 | Ranjan et al. | .................. 326/81 |
| 6,388,469 B1 | * | 5/2002 | Hunt et al. | ..................... 326/81 |
| 6,469,560 B1 | * | 10/2002 | Chang et al. | ................. 327/310 |
| 6,538,868 B2 | * | 3/2003 | Chang et al. | ................. 361/111 |
| 6,803,789 B1 | * | 10/2004 | Yu et al. | ........................ 326/81 |
| 7,336,109 B2 | * | 2/2008 | Lambrache | .................. 327/112 |
| 2003/0223159 A1 | * | 12/2003 | Jenkins et al. | ................. 361/18 |

* cited by examiner

*Primary Examiner*—Vibol Tan
(74) *Attorney, Agent, or Firm*—Sterne, Kessler, Goldstein & Fox P.L.L.C.

(57) ABSTRACT

A high-voltage tolerant output driver for use in a switching regulator is provided herein. The driver allows the switching regulator to regulate supply voltages that exceed device breakdown limits for the process technology from which the high-voltage tolerant output driver is fabricated. Unregulated supply voltages can vary over a wide range. The regulator only needs two intermediate voltages.

46 Claims, 8 Drawing Sheets

HIGH-VOLTAGE TOLERANT OUTPUT DRIVER

BACKGROUND

The invention pertains in general to high-voltage tolerant output drivers and more specifically to a high-voltage tolerant output driver for a switching regulator.

Advances in integrated circuit (IC) technology have led to higher levels of integration (i.e., density) and performance. Today's IC devices have more circuitry than ever and operate at much faster speeds. However, higher circuit densities have correspondingly increased the amount of power dissipated by these devices. IC density is often limited by the amount of power dissipated by the chip and the resulting heat produced.

In order to overcome these and other disadvantages associated with increased density, manufacturers have developed new processes to produce ICs that operate at lower voltage levels. Some common IC operating voltage levels include 5V+/−10%, 3.3V+/−10%, and 2.5V+/−10%. In using decreased voltage levels, manufacturers limit the adverse effects of power dissipation (e.g., heat), while continuing to allow for ever increasing IC densities.

Nevertheless, when a new, low-voltage IC process technology emerges, it is often desirable for the new technology to be able to operate with existing high-voltage levels. IC process technologies, and their respective operating voltages, are often defined by the gate-oxide breakdown voltage between the terminals of a device (e.g., a transistor) implemented using the particular process technology. Consequently, a potential problem with interfacing circuitry implemented in a low-voltage process technology with a voltage that exceeds device limits is that, one or more devices implemented in the low-voltage process may experience damage, either temporary or permanent, that can hinder the circuit's ability to perform its desired function.

A switching regulator, implemented at least partially in a low-voltage IC process technology, is one example circuit where it is often desirable to operate with existing high-voltage levels. For example, a switching regulator implemented in a 2.5 V IC process technology can typically tolerate voltages as high as 2.75 V. However, the switching regulator may be required to regulate an input voltage that may exceed voltages of 2.75 V. Conventional implementations of the switching regulator and, in particular, the output driver circuitry of the switching regulator, cannot tolerate voltages higher than 2.75 V without experiencing problems. As such, conventional output driver circuitry used in a switching regulator cannot regulate voltages that exceed the IC process technology limits, which in this example is 2.75 V.

It is therefore desirable to provide a high-voltage tolerant output driver for use in a switching regulator circuit, implemented in low-voltage IC process technology. Further aspects and advantages of this invention will become apparent from the detailed description that follows.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1A:
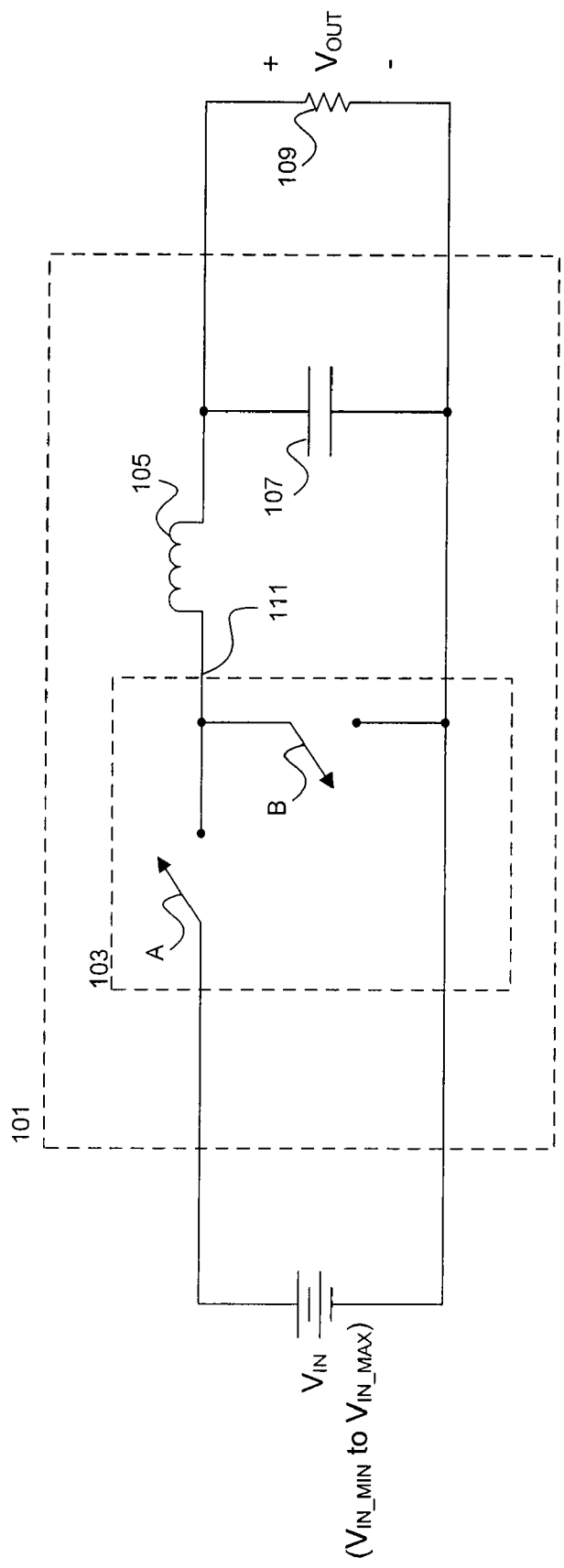
FIG. 1A is a schematic diagram of a high-voltage tolerant output driver implemented in an exemplary buck switching regulator.

Referring to FIG. 1A, an exemplary implementation of a buck switching regulator 101 is provided. Buck switching regulator 101 receives an unregulated input voltage $V_{IN}$ that may vary over a wide voltage range (i.e., $V_{IN\_MIN}$ to $V_{IN\_MAX}$) and provides a regulated output voltage $V_{OUT}$ across representative load 109. Although simply shown as a resistor, representative load 109 may be, for example, a portable communications device or other battery powered devices.

Switching regulators, such as buck switching regulator 101, are often at least partially implemented in an IC using a particular process technology. Depending on the particular process technology used, the IC will be able to tolerate a certain maximum voltage across the terminals of any single device (e.g., a transistor) implemented using the particular process technology. Common process technology voltage limits include 5V+/−10%, 3.3V+/−10%, and 2.5V+/−10%.

Buck switching regulator 101, however, includes high-voltage tolerant output driver 103 that, in accordance with the present invention, provides the ability to regulate an input voltage $V_{IN}$ that may exceed the maximum operating voltage of the process technology used to implement buck switching regulator 101. Without high-voltage tolerant output driver 103, exceeding the device voltage limits dictated by the process technology may result in breakdown of devices used to implement buck-switching regulator 101.

High-voltage tolerant output driver 103 is simplified in FIG. 1A to illustrate only its basic functionality in the context of exemplary buck switching regulator 101. High-voltage tolerant output driver 103, at a high-level, comprises two switching devices A and B. A control circuit, not shown in FIG. 1A, controls the timing in which switches A and B are turned ON and OFF (i.e., the duty cycle) to regulate the flow of power to representative load 109. Inductor 105 and capacitor 107 are energy storage elements that convert the switched current pulses, produced by high-voltage tolerant output driver 103, into a steady current that is provided to load 109. The switched current pulses are provided to inductor 105 via output power signal 111.

As would be appreciated by one skilled in the relevant art(s), high-voltage tolerant output driver 103 may be used in any type of switching regulator, including a buck switching regulator, as shown in FIG. 1A, a boost switching regulator, or a buck-boost switching regulator.

Figure 1B:
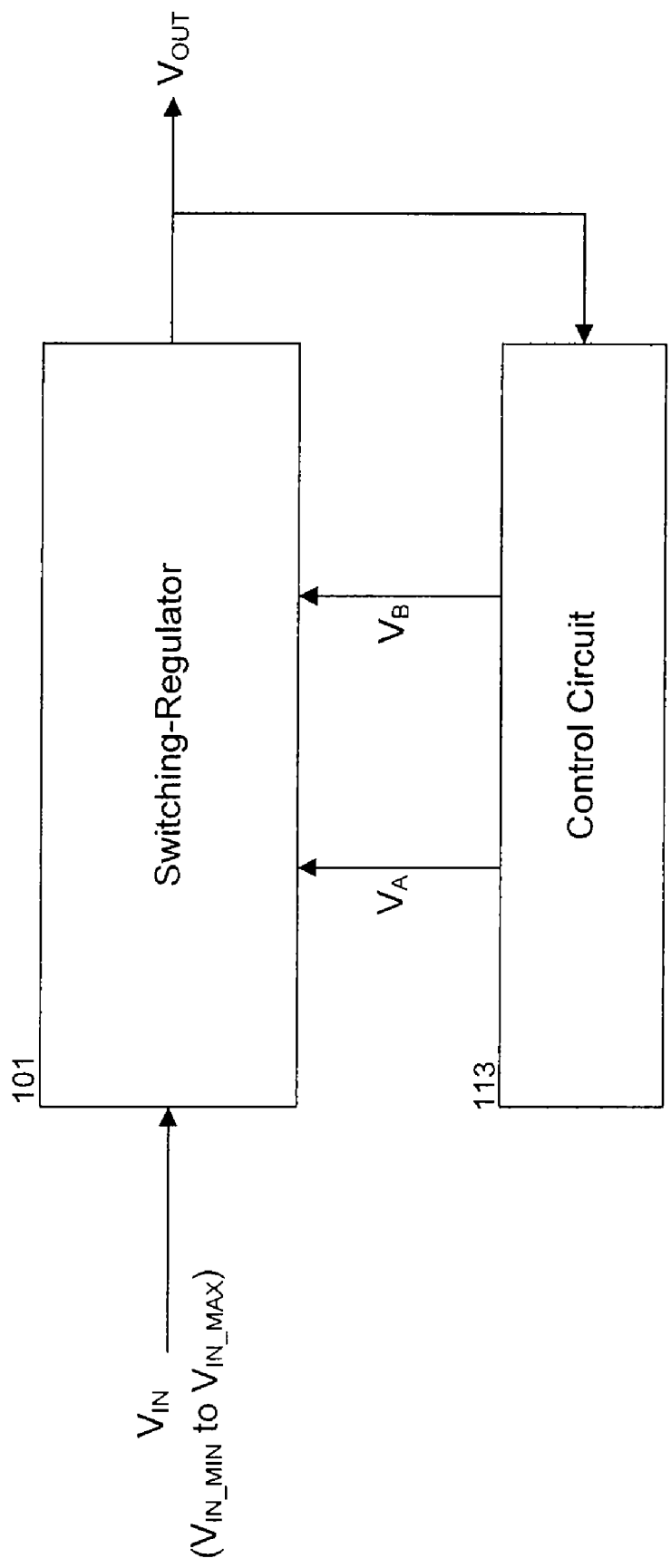
FIG. 1B is a block diagram of a switching regulator and control circuit.

Referring to FIG. 1B, control circuit 113 is illustrated as providing two drive signals $V_A$ and $V_B$. As mentioned above, in regards to FIG. 1A, high-voltage tolerant output driver 103 includes two switching devices A and B. The timing of switch positions A and B are controlled by control circuit 113 via drive signals $V_A$ and $V_B$. Control circuit 113 receives output voltage $V_{OUT}$ and controls drive signals $V_A$ and $V_B$ in order to maintain output voltage $V_{OUT}$ at a regulated value. In embodiments, drive signals $V_A$ and $V_B$ are provided within the voltage limits of the process technology used to implement switching regulator 101.

Figure 2:
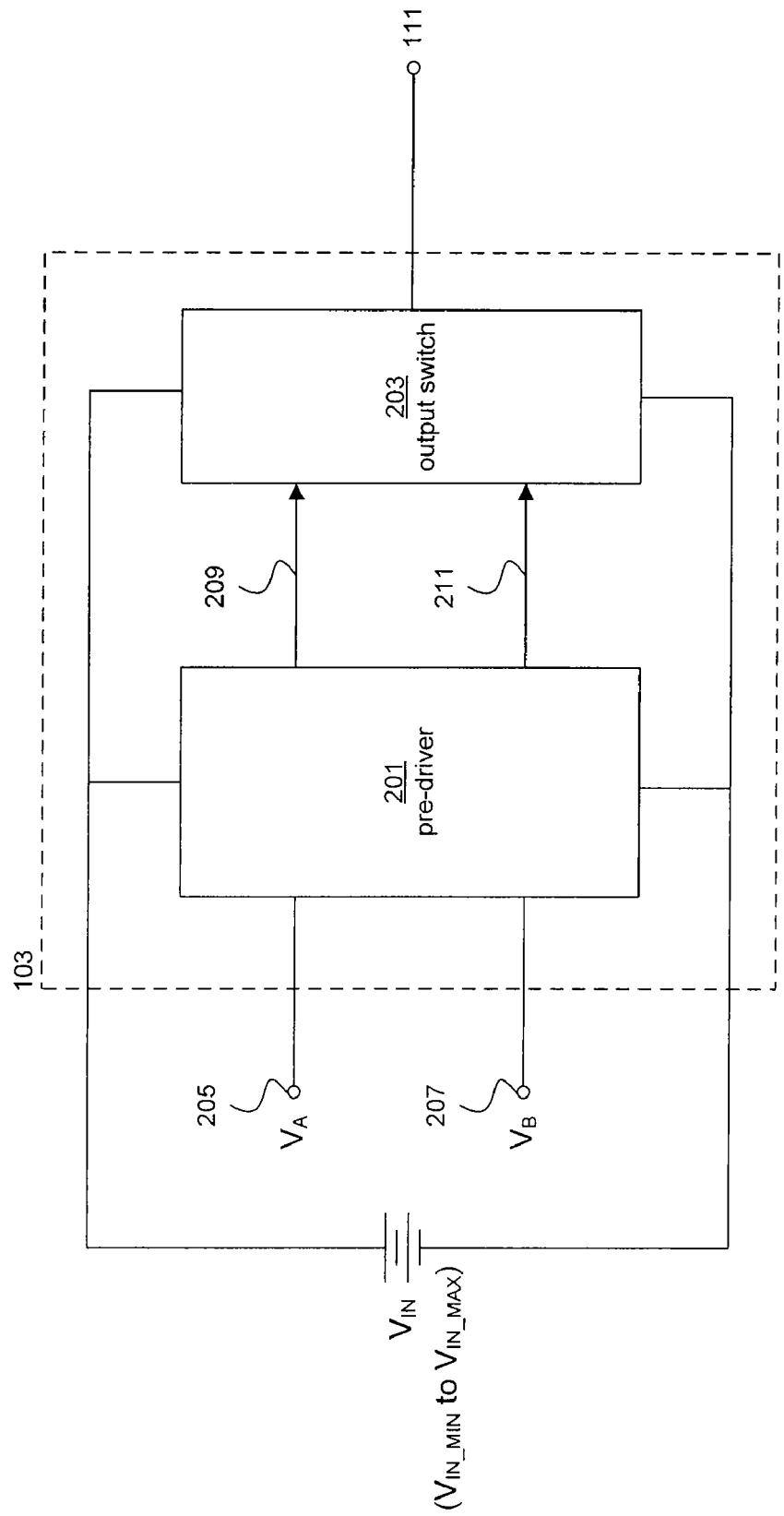
FIG. 2 is a block diagram of an illustrative embodiment of a high-voltage tolerant output driver, consistent with the present invention.

Referring now to FIG. 2, a block diagram of an embodiment of high-voltage tolerant output driver 103, in accordance with the present invention, is illustrated. In embodiments, high-voltage tolerant output driver 103 is fabricated using a low-voltage (e.g., 2.5V+/−10%) semiconductor process.

High-voltage tolerant output driver 103 comprises a pre-driver 201 and an output switch 203. Pre-driver 201 comprises a first input terminal 205 and a second input terminal 207. In operation, first input terminal 205 receives first control signal $V_A$ that varies between ground and a low-voltage $V_{DD}$ at which the semiconductor process used to fabricate the circuit is designed to operate. In operation, second input terminal 207 receives a second control signal $V_B$ that varies within the same voltage range as the first input control signal $V_A$.

In further operation, pre-driver 201 is connected to unregulated input voltage $V_{IN}$ that may exceed the maximum voltage limitations of the low-voltage semiconductor process that high-voltage tolerant output driver 103 is implemented. The unregulated input voltage may vary over a wide range $V_{IN\_MIN}$ to $V_{IN\_MAX}$.

Pre-driver 201 has a first and second output for delivering high-side drive signal 209 and low-side drive signal 211 to output switch 203, respectively. In embodiments, pre-driver 201 is responsible for level-shifting first control signal $V_A$ and second control signal $V_B$ to the voltage level(s) required by output switch 203. The level-shifted versions of control signals $V_A$ and $V_B$ are provided, via high-side drive signal 209 and low-side drive signal 211, to output switch 203.

Output switch 203 receives and processes high-side drive signal 209 and low-side drive signal 211 to provide output power signal 111. Output power signal 111 may exceed the voltage limitations of the process technology used to implement high-voltage tolerant output driver 103. As shown in FIG. 1, high-voltage tolerant output driver 103 may be implemented in exemplary buck regulator 101. However, as would be appreciated by one skilled in the relevant art(s), high-voltage tolerant output driver 103 may be implemented in other switching regulator designs, including boost and buck-boost switching regulators.

A detailed explanation of the operation of high-voltage tolerant output driver 103, in accordance with embodiments of the present invention, is provided in the following sections.

Output Switch Operation

For illustrating the operation of switching regulator 101 it is assumed that high-voltage tolerant output driver 103 is implemented in a 2.5 volt semiconductor process, with a maximum process operating voltage of 2.75 V. The value $V_{DD}$ may be used to refer to the process operating voltage of 2.5 V. Furthermore, it is assumed that unregulated input voltage $V_{IN}$ may vary from $V_{IN\_MIN}$, at 2.3 V, to $V_{IN\_MAX}$, at 5.5 V. Reference to ground is considered 0 V for this example. It will be understood to one skilled in the relevant art(s) that other specific voltage values may be used.

Figure 3:
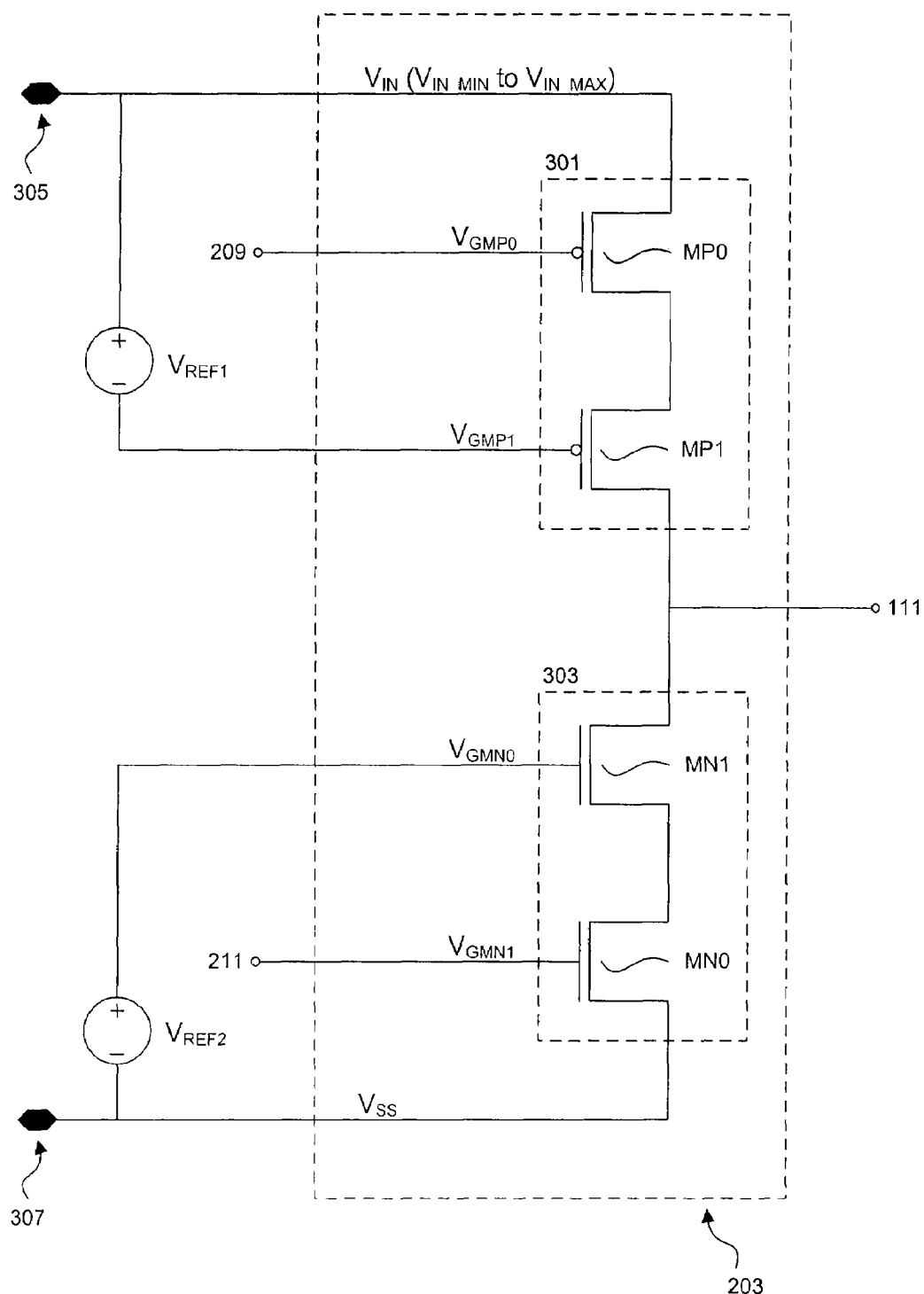
FIG. 3 is a schematic diagram of an illustrative embodiment of an output switch, consistent with the present invention.

Referring to FIG. 3, a schematic diagram of output switch 203 in accordance with one embodiment of the present invention is illustrated. Output switch 203 pulls-up and pulls-down output power signal 111. However, output switch 203 must be able to pull-up output power signal 111 without exceeding the breakdown voltage of any device used to implement output switch 203. Similarly, output switch 203 must be able to pull-down output power signal 111 without exceeding the breakdown voltage of any device used to implement output switch 203.

Output switch 203 includes two power supply connectors 305 and 307. First power supply connector 305 is connected to unregulated input voltage $V_{IN}$ that, as noted above, can vary between 2.3 V ($V_{IN\_MIN}$) and 5.5 V ($V_{IN\_MAX}$). Second power supply connector 307 is connected to ground potential or $V_{SS}$. As noted above, ground potential is considered to be 0 V in this example, but is not limited thereto.

As shown in FIG. 3, output switch 203 uses a complimentary metal oxide semiconductor (CMOS) process with p-channel and n-channel metal oxide field effect transistors (MOSFETs). Output switch 203 comprises a high-side cascode driver 301 for pulling-up output power signal 111 and a low-side cascode driver 303 for pulling-down output power signal 111.

The high-side cascode driver 301 includes p-channel transistors MP0 and MP1. The source of MP0 is coupled to unregulated input voltage $V_{IN}$ via power supply connector 305. The source of second p-channel transistor MP1 is coupled to the drain of MP0 and acts as a cascode device to protect MP0 from high-voltages associated with $V_{IN}$. Since $V_{IN}$ can be as high as 5.5 V (i.e., $V_{IN\_MAX}$), directly applying $V_{IN}$ across the source and drain terminals of MP0 may result in breakdown of the device.

The low-side cascode driver 303 includes n-channel transistors MN0 and MN1. The source of MN0 is coupled to ground potential or $V_{SS}$ via power supply connector 307. The source of second n-channel transistor MN1 is coupled to the drain of MN0 and acts as a cascode device to protect MN0 from high-voltages associated with $V_{IN}$. Since $V_{IN}$ can be as high as 5.5 V (i.e., $V_{IN\_MAX}$), directly applying $V_{IN}$ across the source and drain terminals of MN0 may result in breakdown of the device.

MP0 and MN0 are controlled to pull-up and pull-down output power signal 111. When MP0 is on, MN0 is off and output power signal 111 is pulled-up to $V_{IN}$. Conversely, when MN0 is on, MP0 is off and output power signal 111 is pulled-down to ground or $V_{SS}$.

Cascode device MP1 protects MP0 by ensuring that the drop from $V_{IN}$, coupled to the source of transistor MP0, to ground potential, is shared between these two transistors. The protection of MP0 is needed when high-side cascode driver 301 is off and output power signal 111 is being pulled-low by low-side cascode driver 303.

Similarly, cascode device MN1 protects MN0 by ensuring that the drop from $V_{IN}$ to ground potential is shared between these two transistors. The protection of MN0 is needed when low-side cascode driver 303 is off and output power signal 111 is being pulled-high by high-side cascode driver 301.

In a traditional output switch, the gates of MP0 and MN0 would be driven with equivalent voltage levels, such as 0 and 2.5 V. When the gates of MP0 and MN0 are logically low at 0 V the output of the device would be pulled high, and when they are logically high at 2.5 V the output of the device would be pulled low. However, to protect MP0 and MN0 from experiencing voltage drops of greater than 2.75 V, the gates of MP0 and MN0 are controlled differently.

When the high-side cascode driver 301 is off, the gate of MP0 is held in its logic high state and is brought equal to $V_{IN}$. Since the source of transistor MP0 is also at $V_{IN}$, the transistor remains off. However, when high-side cascode driver 301 is on, the gate voltage of MP0 is held in a logic low state and is equal to:

$$V_{GMP0} = V_{IN} - \frac{V_{IN\_MAX}}{2} \quad (1)$$

Keeping the gate voltage of MP0 at the level noted above by equation (1), turns the transistor on, while preventing MP0 from experiencing a gate-to-source voltage drop greater than 2.75 V, avoiding break down of the device.

The gate of cascode device MP1 is coupled to a first reference voltage $V_{REF1}$ of voltage value $V_{IN\_MAX}/2$ (i.e., 2.75 V in this example) that is in series with unregulated input voltage $V_{IN}$. Consequently the gate voltage of MP1 is equal to:

$$V_{GMP1} = V_{IN} - \frac{V_{IN\_MAX}}{2} \quad (2)$$

Unlike the gate voltage of MP0, MP1 is always equal to the above voltage level expressed by equation (2) and does not change when high-side cascode driver 301 turns on and off.

When the gate of MP0 transitions to $V_{IN}$, the high-side cascode driver 301 turns off and the low-side cascode driver 303 turns on, pulling-down output power signal 111 to ground. As the drain of MP0 and the source of cascode device MP1 drops to $V_{IN}-(V_{IN\_MAX}/2)+V_{tp}$, MP1 turns off ($V_{tp}$ being the threshold voltage of p channel devices MP0 and MP1). MP1 turns off since its gate is tied to $V_{IN}-(V_{IN\_MAX}/$ 2). This prevents further discharge of the intermediate node between MP0 and MP1 and effectively protects MP0 from a large voltage drop of $V_{IN}$.

As can be seen from equations (1) and (2) above, gate voltage $V_{GMP0}$ and $V_{GMP1}$ track with $V_{IN}$ and allow $V_{IN}$ to operate over a wide voltage range. In this example, $V_{IN}$ can be anywhere between 2.3 and 5.5 V. Unregulated input voltage $V_{IN}$, in general, can be upwards of twice the voltage limitations of the process technology used to implement high-voltage tolerant output driver 103.

The gates of transistors MN0 and MN1 are controlled in a similar manner as the gates of MP0 and MP1 noted above. When the low-side cascode driver 303 is off, the gate of MN0 is held in its logic low state and is brought equal to 0 V (i.e., ground or $V_{SS}$) in this example. Since the source of transistor MN0 is also at 0 V, the transistor remains off. However, when low-side cascode driver 303 is on, the gate voltage of MN0 is held in a logic high state and is equal to:

$$V_{GMN0} = \frac{V_{IN\_MAX}}{2} \quad (3)$$

The gate of cascode device MN1 is coupled to a second reference voltage $V_{REF2}$. Consequently the gate voltage of MN1 is equal to:

$$V_{GMN1} = \frac{V_{IN\_MAX}}{2} \quad (4)$$

Unlike the gate voltage of MN0, MN1 is always equal to the above voltage expressed by equation (4) and does not change when low-side cascode driver 303 turns on and off.

When the gate of MN0 transitions to 0 V, the low-side cascode driver 303 turns off and the high-side cascode driver 301 turns on, pulling-up output power signal 111 to $V_{IN}$. As the connection between the drain of MN0 and the source of cascode device MN1 is pulled up to $(V_{IN\_MAX}/2)-V_{tn}$, MN1 turns off ($V_{tn}$ being the threshold voltage of n channel devices MN0 and MN1). MN1 turns off since its gate is tied to $V_{IN\_MAX}/2$. This prevents further discharge of the intermediate node between MN0 and MN1 and effectively protects MN0 from a large voltage drop of $V_{IN}$. Unregulated input voltage $V_{IN}$, in general, can be upwards of twice the voltage limitations of the process technology used to implement high-voltage tolerant output driver 103.

Pre-Driver Operation

Figure 4:
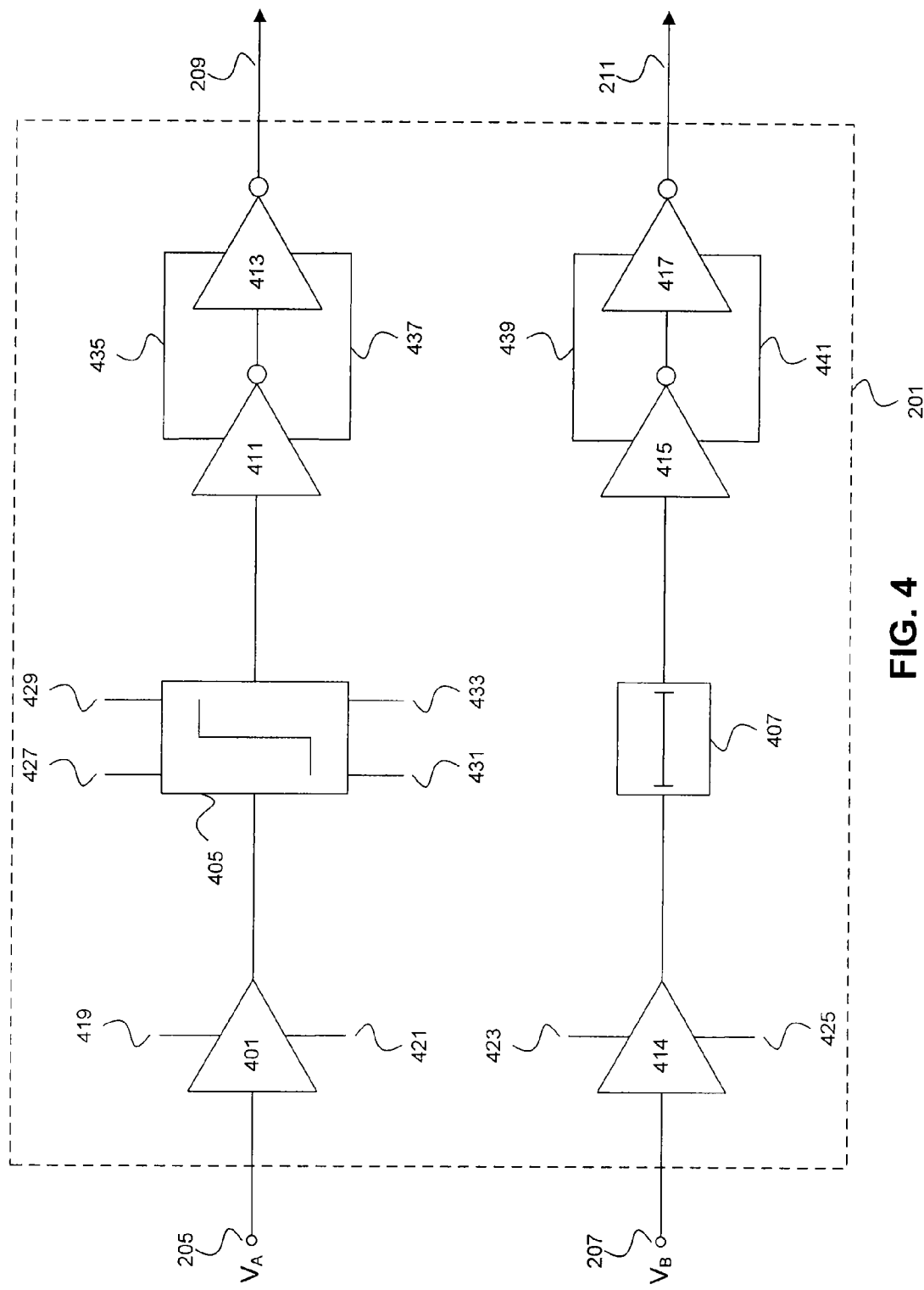
FIG. 4 is a block diagram of an illustrative embodiment of a pre-driver, consistent with the present invention.

FIG. 4 is a schematic diagram of an embodiment of pre-driver 201 in accordance with the present invention.

Pre-driver 201 comprises first input terminal 205 and second input terminal 207. Input terminal 205 is responsible for receiving a first control signal $V_A$ that varies between ground and a low voltage $V_{DD}$ at which the semiconductor process used to fabricate the circuit is designed to operate (e.g., 2.5 V). Input terminal 207 is responsible for receiving a second control signal $V_B$ that varies across the same voltage range as the first control signal $V_A$. In addition, pre-driver 201 has a first and second output for delivering high-side drive signal 209 and low-side drive signal 211 to output switch 203 (See FIG. 2), respectively.

In embodiments, pre-driver 201 is responsible for level-shifting input control signal $V_A$ and $V_B$, received at input terminals 205 and 207, to the appropriate values required by high-side drive signal 209 and low-side drive signal 211.

High-side drive signal 209 is coupled to the gate of MP0 (see FIG. 3) and, as detailed above, the gate of MP0 is driven to a voltage level $V_{IN}-(V_{IN\_MAX}/2)$ when on and $V_{IN}$ when off. Consequently, pre-driver 201 receives first control signal $V_A$ at input terminal 205, which varies from 0 V to $V_{DD}$ (e.g., 2.5 V), and level shifts this signal to vary from $V_{IN}-(V_{IN\_MAX}/2)$ to $V_{IN}$. Low-side drive signal 211, on the other hand, is coupled to the gate of MN0 (see FIG. 3) and, as detailed above, the gate of MN0 is driven to 0 V when off and $V_{IN\_MAX}/2$ when on. Consequently, pre-driver 201 need only adjust input control signal $V_B$, received at input terminal 207, from $V_{DD}$ to $V_{IN\_MAX}/2$. No adjustment is needed when the input control signal $V_B$, received at input terminal 207, is logically low at 0 V. The flow of input control signals $V_A$ and $V_B$, received at input terminals 205 and 207, to high-side drive signal 209 and low-side drive signal 211 is detailed below.

The first input control signal $V_A$ is received by buffer 401 via input terminal 205. Buffer 401 has supply connections of $V_{IN\_MAX}/2$ at power connector 419 and ground at power connector 421. The output of buffer 401 transfers the input from the domain of—0 V to $V_{DD}$, to the domain of—0 V to $V_{IN\_MAX}/2$. The output of buffer 401 is then input into level-shifter 405. Level shifter 405 has multiple power connections. Level-shifter 405 is coupled to $V_{IN\_MAX}/2$ at power connector 427, to $V_{IN}$ at power connector 429, to $V_{IN}-(V_{IN\_MAX}/2)$ at power connector 431, and $V_{SS}$ or ground at power connector 433. The output of level-shifter 405 is then input into inverter chain 411-413. In this example, level-shifter 405 not only level-shifts its input signal, but also inverts. As would be appreciated by one skilled in the relevant art(s), this inversion may be done elsewhere in the circuit. Inverter chain 411-413 has power connector 435 coupled to $V_{IN}$ and power connector 437 coupled to $V_{IN}-(V_{IN\_MAX}/2)$. Inverters 411 and 413 function as a signal buffer, so that the output can drive a large capacitive load.

The second input control signal $V_B$ is received by buffer 414 via input terminal 207. Buffer 414 has supply connections of $V_{IN\_MAX}/2$ at power connector 423 and $V_{SS}$ or ground at power connector 425. The output of buffer 414 transfers the input from the domain of—0 V to $V_{DD}$, to the domain of—0 V to $V_{IN\_MAX}/2$. The output of buffer 414 is then input into delay block 407, which delays and inverts the output of buffer 414 to match the delay and inversion produced by level shifter 405. The output of delay block 407 is then input into inverter chain 415-417. Inverter chain 415-417 has power connector 439 coupled to $V_{IN\_MAX}/2$ and power connector 441 coupled to $V_{SS}$ or ground. Inverters 415 and 417 function as a signal buffer, so that the output can drive a large capacitive load. Furthermore, inverter chain 411-413 and inverter chain 415-417 are implemented in a manner to provide good delay matching between the two inverter chains.

Figure 5:
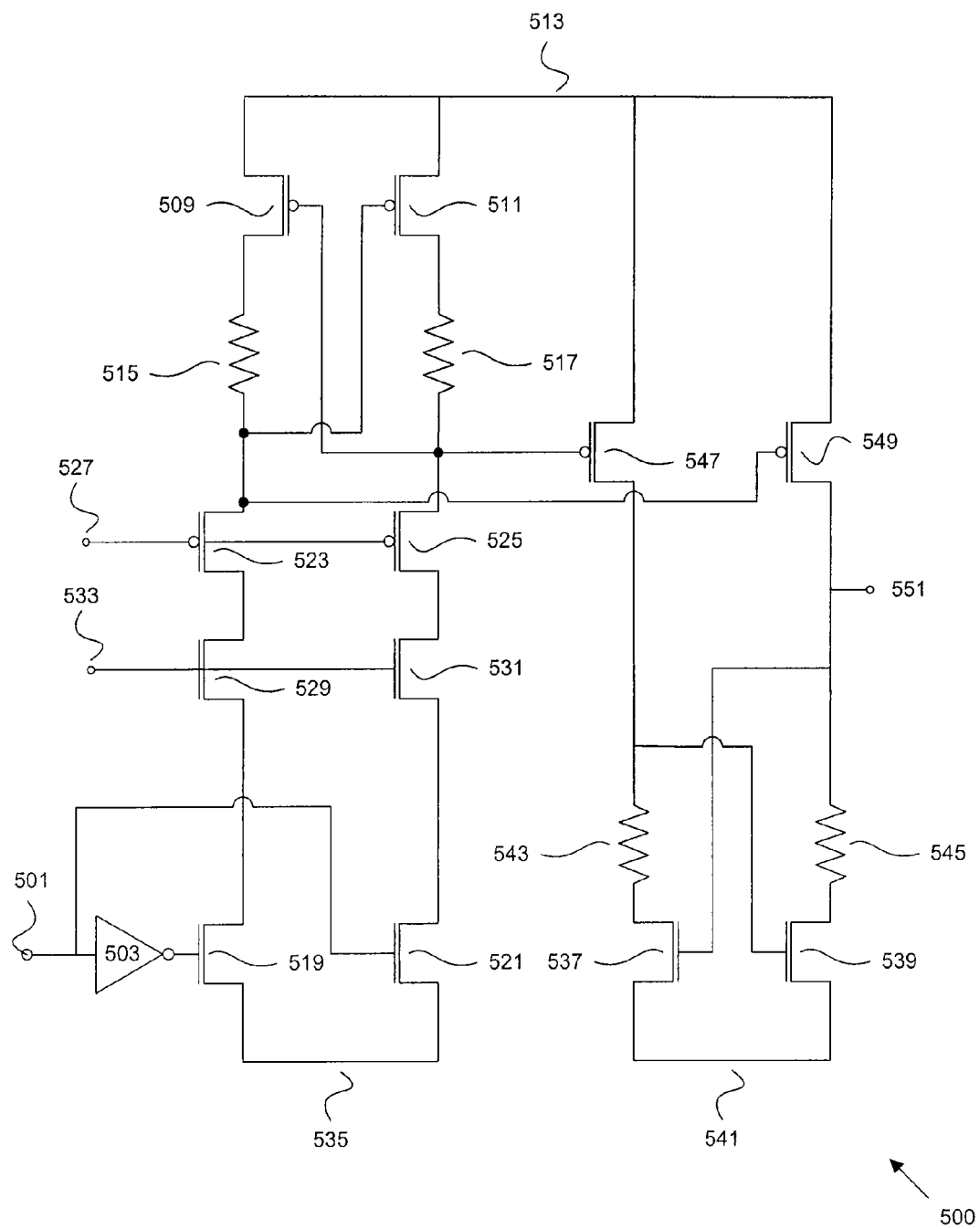
FIG. 5 is a schematic diagram of an illustrative embodiment of a static type voltage level shifter, consistent with the present invention.

FIG. 5 is a schematic diagram of one embodiment of level shifter 405 (shown in FIG. 4). Level shifter 500 is referred to as a static voltage type level shifter; only when the inputs of level shifter 500 switch does the circuit consume power. Consequently, level shifter 500 is well suited for low power applications.

The input to level shifter 500 is received at input terminal 501 and ranges from $V_{SS}$ or ground to $V_{IN\_MAX}/2$. As noted above, $V_{IN\_MAX}/2$ is 2.75 V for this example and is the maximum voltage any single device implemented in this exemplary 2.5 volt semiconductor process can tolerate. Level shifter 500 is responsible for level shifting the input received at input terminal 501 from the domain of $V_{SS}$ to $V_{IN\_MAX}/2$, to the domain of $V_{IN}-(V_{IN\_MAX}/2)$ to $V_{IN}$, without causing damage to any of the devices used in the implementation of level shifter 500. The operation of level shifter 500 will now be described assuming that the input signal received at input terminal 501 is logically low at ground level (i.e., 0 V).

The input signal to level shifter 500, assumed to be 0 V for purposes of explanation, is received by the gates of n-channel transistors 519 and 521 that form a differential pair. Before being received by n-channel transistor 519, the input signal is inverted by inverter 503. Consequently, n-channel transistor 519 conducts and n-channel transistor 521 does not conduct. The sources of n-channel transistors 519 and 521 are coupled to ground or $V_{SS}$ via 535. The drains of n-channel transistors 519 and 521 are coupled to p-channel protection transistors 523 and 525 through n-channel protection transistors 529 and 531, respectively. The gates of n-channel protection transistors 529 and 531 are coupled to voltage level $V_{IN\_MAX}/2$ via input terminal 533. The gates of p-channel transistors 523 and 525 are coupled to voltage level $V_{IN}-(V_{IN\_MAX}/2)$ via input terminal 527. As a result of n-channel transistor 519 being on and conducting, the connection between transistors 519 and 529, as well as the connection between transistors 529 and 523 are brought equal to ground or $V_{SS}$.

The sources of p-channel transistors 523 and 525 are coupled to resistors 515 and 517, respectively. The drains of cross-coupled p-channel transistors 509 and 511 are coupled to the opposite ends of resistors 515 and 517, respectively. Resistors 515 and 517 help to reduce the drive-strength requirement of n-channel transistors 519 and 521 to toggle cross-coupled p-channel transistors 509 and 511. The sources of cross-coupled p-channel transistors 509 and 511 are coupled to $V_{IN}$ via 513. The gates of cross-coupled p-channel transistors 509 and 511 are coupled to the sources of p-channel transistors 525 and 523, respectively. The source of p-channel transistor 523 is at $V_{IN}-(V_{IN\_MAX}/2)+V_{TP}$, therefore, p-channel transistor 511 conducts. The connection between the drain of p-channel transistor 511 and resistor 517, and the connection between the opposite end of resistor 517 and the source of p-channel transistor 525 is brought equal to voltage level $V_{IN}$. Consequently, the gate of p-channel transistor 509 is brought equal to voltage level $V_{IN}$ and is off.

The sources of p-channel transistors 547 and 549 are coupled to voltage supply $V_{IN}$ via 513. The gate of p-channel transistor 547 is coupled to the gate of p-channel transistor 509, which is at voltage level $V_{IN}$. Consequently, p-channel transistor 547 is off. The gate of p-channel transistor 549 is coupled to the gate of p-channel transistor 511, which is at $V_{IN}-(V_{IN\_MAX}/2)+V_{TP}$. Consequently, p-channel transistor 549 conducts. The drains of p-channel transistors 547 and 549 are coupled to resistors 543 and 545, respectively. The drains of cross-coupled n-channel transistors 537 and 539 are coupled to the opposite ends of resistors 543 and 545, respectively. Resistors 543 and 545 help to reduce the drive-strength requirement of p-channel transistors 547 and 549 to toggle cross-coupled n-channel transistors 537 and 539. The sources of n-channel transistors 537 and 539 are coupled to voltage source $V_{IN}-(V_{IN\_MAX}/2)$ via 541. The gates of n-channel transistors 537 and 539 are coupled to the drains of p-channel transistors 549 and 547, respectively. Since p-channel transistor 549 conducts, the connection between p-channel transistor 549 and resistor 545 is brought equal to voltage level $V_{IN}$ and n-channel transistor 537 conducts. As a result of n-channel transistor 537 conducting, the connection between n-channel transistor 537 and resistor 543, as well as the connection between resistor 543 and p-channel transistor 547, are brought equal to voltage level $V_{IN}-(V_{IN\_MAX}/2)$.

The output of level shifter 500 is taken from the connection between p-channel transistor 549 and resistor 545 and is therefore level-shifted to the desired voltage level $V_{IN}$. As is apparent, assuming the input to level shifter 500 is at voltage level $V_{IN\_MAX}/2$ (i.e., a logic high), the output will be level shifted to the desired voltage level $V_{IN}-(V_{IN\_MAX}/2)$.

Figure 6A:
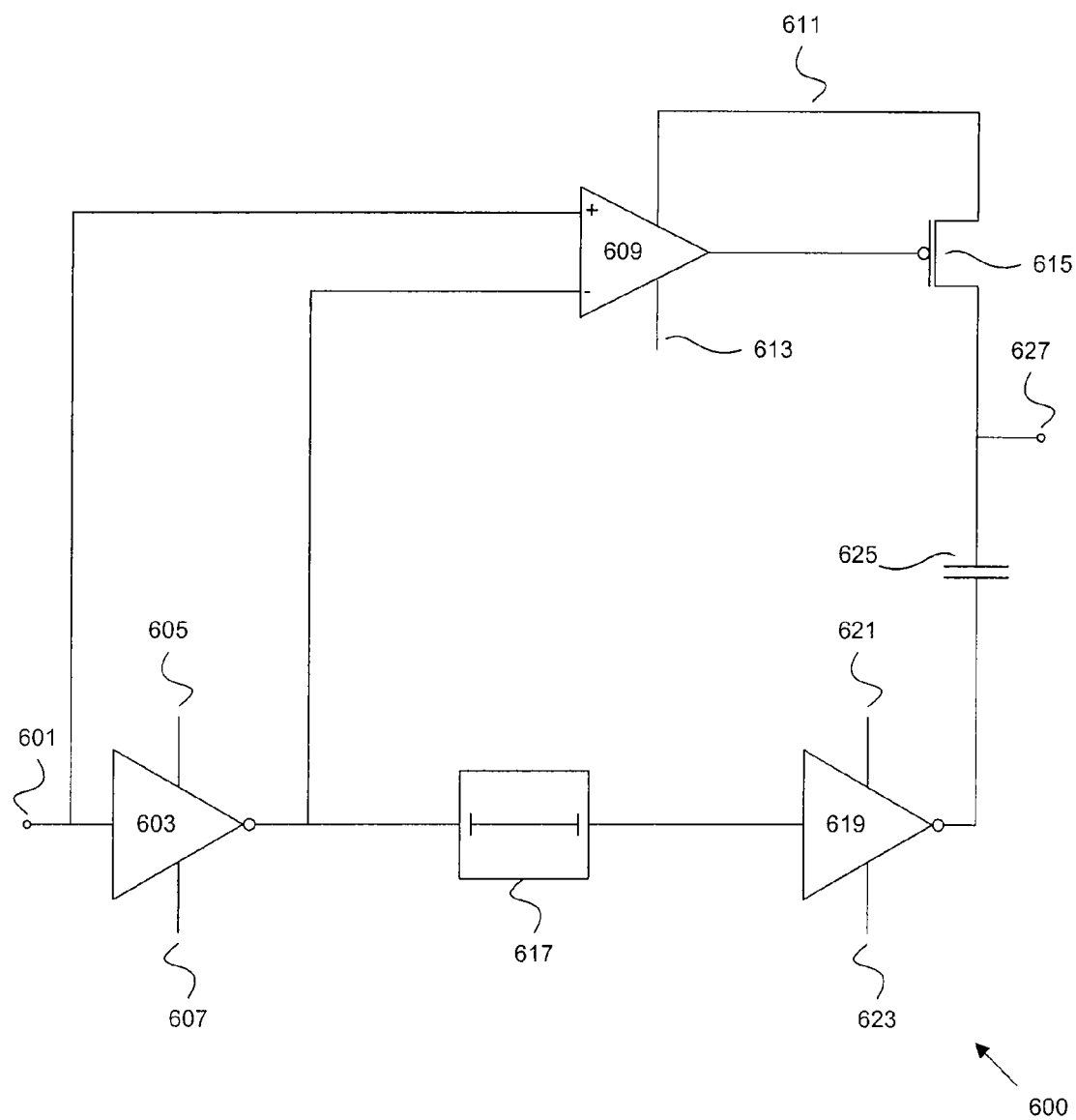
FIG. 6A is schematic of an illustrative embodiment of a capacitive type voltage level shifter, consistent with the present invention.

FIG. 6A is a schematic diagram of another embodiment of level shifter 405 (see FIG. 4) in accordance with the present invention. Level shifter 600 is a capacitive type level shifter.

The input to level shifter 600 is received at input terminal 601 and ranges from $V_{SS}$ or ground to $V_{IN\_MAX}/2$. As noted above, $V_{IN\_MAX}/2$ is 2.75 V for this example and is the maximum voltage any single device implemented in this exemplary 2.5 volt semiconductor process can tolerate. Level shifter 600 is responsible for level shifting this input from the domain of $V_{SS}$ to $V_{IN\_MAX}/2$, to the domain of $V_{IN}-(V_{IN\_MAX}/2)$ to $V_{IN}$, without causing damage to any of the devices used in the implementation of level shifter 600. The operation of level shifter 600 will now be described assuming that the input signal received at input terminal 601 is logically low at ground level (i.e., 0 V).

The input signal to level shifter 600, assumed to be ground or 0 V for purposes of explanation, is received by inverter 603 and the non-inverting input terminal of differential amplifier 609. Inverter 603 has supply connections of $V_{IN\_MAX}/2$ at power connector 605 and $V_{SS}$ or ground at power connector 607. Differential amplifier 609 has supply connections of $V_{IN}$ at power connector 611 and ground or $V_{SS}$ at power connector 613. The inverting input of differential amplifier is connected to the output of inverter 603. When the input received at 601 is logically low at ground, the non-inverting input to differential amplifier 609 is at ground, and the inverting input of differential amplifier 609, connected to the output of inverter 603, is at a voltage level of $V_{IN\_MAX}/2$. The output of differential amplifier 609 will be greater than a threshold drop, $V_{tp}$, below voltage level $V_{IN}$, such that p-channel transistor 615 will fully conduct. The gate of p-channel transistor 615 is tied to the output of differential amplifier 609, and the source of p-channel transistor 615 is coupled to voltage supply $V_{IN}$ via power connector 611.

The output of inverter 603 is also connected to delay block 617. Delay block 617 delays and inverts the input signal it receives to match the delay of differential amplifier 609. The output of delay block 617 is subsequently input into inverter 619. Inverter 619 has supply connections of $V_{IN\_MAX}/2$ at power connector 621 and $V_{SS}$ or ground at power connector 623. Since delay block 617 delays and invertes the output of inverter 603, which is at voltage level $V_{IN\_MAX}/2$, the input to inverter 619 is at ground or $V_{SS}$. Therefore, the output of inverter 619 is brought to voltage level $V_{IN\_MAX}/2$.

The output of level shifter 600 is taken between the drain of p-channel transistor 615 and the top terminal of capacitor 625 at output terminal 627. The top terminal of capacitor 625 is charged to $V_{IN}$, and therefore the output of level-shifter 600 is at the desired voltage level of $V_{IN}$.

Assuming the opposite logic value at input 601 (i.e., a logic high), input 601 would be at voltage level $V_{IN\_MAX}/2$ and inverter 619 would pull the bottom terminal of capacitor 625 to ground or $V_{SS}$. Due to charge conservation at capacitor 625, and assuming small charge redistribution with parasitic capacitances associated with p-channel transistor 615, the output terminal 627 will be brought to the desired voltage level $V_{IN}-(V_{IN\_MAX}/2)$.

Figure 6B:
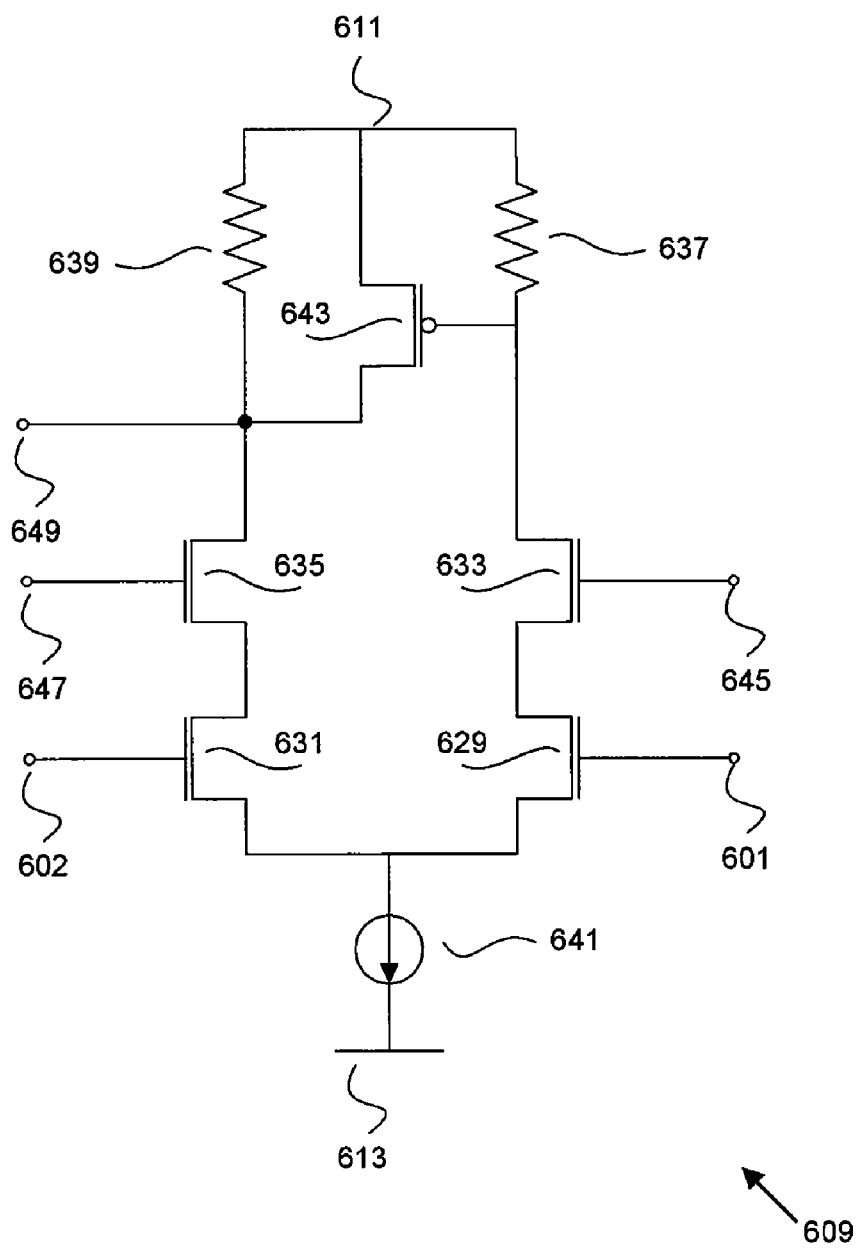
FIG. 6B is schematic diagram of an illustrative embodiment of a differential amplifier that can be used in the capacitive type level shifter of FIG. 5, consistent with the present invention.

FIG. 6B is a schematic diagram of an example embodiment of differential amplifier 609 shown in FIG. 6A. Differential amplifier 609 has non-inverting input 601 and inverting input 602. Non-inverting input 601 is coupled to the gate of n-channel transistor 629 and inverting input 602 is coupled to the gate of n-channel transistor 631. The source of n-channel transistors 629 and 631 are coupled to ground or $V_{SS}$ via current source 641. Current source 641 provides a current equal to $I_{REF}$. The drain of n-channel transistors 629 and 631 are coupled to the sources of n-channel protection transistors 633 and 635, respectively. The gates of n-channel protection transistors 645 and 647 are coupled to voltage level $V_{IN\_MAX}/2$. Two resistors 637 and 639 are coupled to the drains of n-channel protection transistors 633 and 635, respectively. The opposite terminals of resistors 637 and 639 are coupled to high-voltage $V_{IN}$.

When non-inverting input 601 is a logic high, non-inverting input 602 is a logic low, and vice-versa. Consequently, when non-inverting input 601 is a logic high, n-channel transistor 629 conducts and n-channel transistor 631 is off. Output 649 of differential amplifier 609 is therefore brought equal to voltage level $V_{IN}$. Conversely, when non-inverting input 602 is a logic high, n-channel transistor 631 conducts and n-channel transistor 629 if off. In this instance, current $I_{REF}$, provided by current source 641, flows entirely through the circuit branch containing resistor 639 and n-channel transistors 635 and 631. The output is therefore brought to voltage level $V_{IN}$ minus the voltage drop across resistor 639, or $V_{IN}-(R_{639}*I_{REF})$. The values of resistor $R_{639}$ and current $I_{REF}$ are selected such that the voltage drop across resistor 639 is greater than one channel transistor threshold drop, $V_{tp}$, and enough to fully turn on p-channel transistor 615 of FIG. 6.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A high-voltage tolerant output driver, implemented in a low-voltage semiconductor process, for use in a switching regulator circuit, the high-voltage tolerant output driver comprising:
    a pre-driver configured to receive and process a first and second control signal and provide a first and second drive signal, the pre-driver comprising:
        a level shifter coupled between the first control signal and the first drive signal; and
        a delay block coupled between the second control signal and the second drive signal; and
    an output switch configured to receive and process the first and second drive signals and provide an output power signal, wherein a voltage of the output power signal exceeds a breakdown voltage for devices implemented in the semiconductor process.

2. The high-voltage tolerant output driver of claim 1, wherein the devices are transistors.

3. The high-voltage tolerant output driver of claim 1, wherein an operating voltage of the semiconductor process is $V_{DD}$.

4. The high-voltage tolerant output driver of claim 3, wherein the breakdown voltage is $V_{DD}+10\%$.

5. The high-voltage tolerant output driver of claim 1, wherein the switching regulator circuit regulates an unregulated input voltage $V_{IN}$.

6. The high-voltage tolerant output driver of claim 5, wherein the unregulated input voltage $V_{IN}$ exceeds the breakdown voltage.

7. The high-voltage tolerant output driver of claim 5, wherein the unregulated input voltage $V_{IN}$ is twice the breakdown voltage.

8. The high-voltage tolerant output driver of claim 5, wherein the output switch tracks with the unregulated input voltage $V_{IN}$.

9. The high-voltage tolerant output driver of claim 1, wherein the voltage of the output power signal is twice the breakdown voltage.

10. The high-voltage tolerant output driver of claim 1, wherein the output switch comprises:
   a high-side cascode driver; and
   a low-side cascode driver.

11. The high-voltage tolerant output driver of claim 10, wherein the high-side cascode driver pulls-up the output power signal to a logic high level, and the low-side cascode driver pulls-down the output power signal to a logic low level.

12. The high-voltage tolerant output driver of claim 10, wherein the high-side cascode driver includes a first and second PMOS device and the low-side cascode driver includes a first and second NMOS device.

13. The high-voltage tolerant output driver of claim 12, wherein:
   the first PMOS device is coupled between a power connection and the second PMOS device, the gate of the first PMOS device coupled to the first drive signal, and the second PMOS device coupled between the first PMOS device and an output, the gate of the second PMOS device coupled to a first reference supply, whereby a gate to source voltage of the first PMOS device does not exceed the breakdown voltage; and
   the first NMOS device is coupled between a ground voltage level and the second NMOS device, the gate of the first NMOS device coupled to the second drive signal, and the second NMOS device coupled between the first NMOS device and an output, the gate of the second NMOS device coupled to a second reference supply, whereby a gate to source voltage of the first NMOS device does not exceed the breakdown voltage.

14. The high-voltage tolerant output driver of claim 13, wherein the power connection is coupled to an unregulated input voltage $V_{IN}$ that varies between a first, higher voltage level $V_{IN\_MAX}$ and a second, lower voltage level $V_{IN\_MIN}$.

15. The high-voltage tolerant output driver of claim 14, wherein the first reference supply tracks with the unregulated input voltage $V_{IN}$ and is equal to $V_{IN}-(V_{IN\_MAX}/2)$.

16. The high-voltage tolerant output driver of claim 14, wherein the second reference supply is equal to $V_{IN\_MAX}/2$.

17. The high-voltage tolerant output driver of claim 1, wherein the first and second control signals operate below the breakdown voltage.

18. The high-voltage tolerant output driver of claim 1, wherein the level shifter is configured to level shift the first control signal to provide a level shifted first control signal, the level shifted first control signal being the first drive signal.

19. The high-voltage tolerant output driver of claim 1, wherein the first drive signal exceeds the breakdown voltage for devices implemented in the semiconductor process.

20. The high-voltage tolerant output driver of claim 1, wherein the delay block is configured to provide a delay to match a delay associated with the level shifter.

21. The high-voltage tolerant output driver of claim 1, wherein the level shifter is a capacitive voltage type level shifter.

22. The high-voltage tolerant output driver of claim 1, wherein the level shifter is a static voltage type level shifter.

23. The high-voltage tolerant output driver of claim 1, wherein the switching regulator is at least one of a buck regulator, a boost regulator, and a buck-boost regulator.

24. A high-voltage tolerant output driver, implemented in a low-voltage semiconductor process, the high-voltage tolerant output driver comprising:
   a pre-driver configured to receive and process a first and second control signal and provide a first and second drive signal, the pre-driver comprising:
      a level shifter coupled between the first control signal and the first drive signal; and
      a delay block coupled between the second control signal and the second drive signal; and
   an output switch configured to receive and process the first and second drive signals and provide an output power signal,
   wherein a voltage of the output power signal exceeds a breakdown voltage for devices implemented in the semiconductor process,
   wherein the high-voltage tolerant output driver is configured to drive an output of a switching regulator circuit.

25. The high-voltage tolerant output driver of claim 24, wherein the devices are transistors.

26. The high-voltage tolerant output driver of claim 24, wherein an operating voltage of the semiconductor process is $V_{DD}$.

27. The high-voltage tolerant output driver of claim 26, wherein the breakdown voltage is $V_{DD}+10\%$.

28. The high-voltage tolerant output driver of claim 24, wherein the switching regulator circuit regulates an unregulated input voltage $V_{IN}$.

29. The high-voltage tolerant output driver of claim 28, wherein the unregulated input voltage $V_{IN}$ exceeds the breakdown voltage.

30. The high-voltage tolerant output driver of claim 28, wherein the unregulated input voltage $V_{IN}$ is twice the breakdown voltage.

31. The high-voltage tolerant output driver of claim 28, wherein the output switch tracks with the unregulated input voltage $V_{IN}$.

32. The high-voltage tolerant output driver of claim 24, wherein the voltage of the output power signal is twice the breakdown voltage.

33. The high-voltage tolerant output driver of claim 24, wherein the output switch comprises:
   a high-side cascode driver; and
   a low-side cascode driver.

34. The high-voltage tolerant output driver of claim 33, wherein the high-side cascode driver pulls-up the output power signal to a logic high level, and the low-side cascode driver pulls-down the output power signal to a logic low level.

35. The high-voltage tolerant output driver of claim 33, wherein the high-side cascode driver includes a first and second PMOS device and the low-side cascode driver includes a first and second NMOS device.

36. The high-voltage tolerant output driver of claim 35, wherein:
   the first PMOS device is coupled between a power connection and the second PMOS device, the gate of the first PMOS device coupled to the first drive signal, and the second PMOS device coupled between the first PMOS device and an output, the gate of the second PMOS device coupled to a first reference supply, whereby a gate to source voltage of the first PMOS device does not exceed the breakdown voltage; and the first NMOS device is coupled between a ground voltage level and the second NMOS device, the gate of the first NMOS device coupled to the second drive signal, and the second NMOS device coupled between the first NMOS device and an output, the gate of the second NMOS device coupled to a second reference supply, whereby a gate to source voltage of the first NMOS device does not exceed the breakdown voltage.

37. The high-voltage tolerant output driver of claim 36, wherein the power connection is coupled to an unregulated input voltage $V_{IN}$ that varies between a first, higher voltage level $V_{IN\_MAX}$ and a second, lower voltage level $V_{\_MIN}$.

38. The high-voltage tolerant output driver of claim 37, wherein the first reference supply tracks with the unregulated input voltage $V_{IN}$ and is equal to $V_{IN\_}(V_{IN\_MAX}/2)$.

39. The high-voltage tolerant output driver of claim 37, wherein the second reference supply is equal to $V_{IN\_MAX}/2$.

40. The high-voltage tolerant output driver of claim 1, wherein the first and second control signals operate below the breakdown voltage.

41. The high-voltage tolerant output driver of claim 1, wherein the level shifter level shifts the first control signal and provides a level shifted first control signal at the first output, the level shifted first control signal being the first drive signal.

42. The high-voltage tolerant output driver of claim 1, wherein the first drive signal exceeds the breakdown voltage for devices implemented in the semiconductor process.

43. The high-voltage tolerant output driver of claim 1, wherein the delay block provides a delay to match a delay associated with the level shifter.

44. The high-voltage tolerant output driver of claim 1, wherein the level shifter is a capacitive voltage type level shifter.

45. The high-voltage tolerant output driver of claim 1, wherein the level shifter is a static voltage type level shifter.

46. The high-voltage tolerant output driver of claim 1, wherein the switching regulator is at least one of a buck regulator, a boost regulator, and a buck-boost regulator.

* * * * *